(12) United States Patent
Abe

(10) Patent No.: US 10,147,662 B2
(45) Date of Patent: Dec. 4, 2018

(54) CIRCUIT BOARD AND ELECTRONIC DEVICE PROVIDED WITH SAME

(71) Applicant: Kyocera Corporation, Kyoto (JP)

(72) Inventor: Yuuichi Abe, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 15/522,322

(22) PCT Filed: Oct. 29, 2015

(86) PCT No.: PCT/JP2015/080585
§ 371 (c)(1),
(2) Date: Apr. 27, 2017

(87) PCT Pub. No.: WO2016/068248
PCT Pub. Date: May 6, 2016

(65) Prior Publication Data
US 2017/0358513 A1 Dec. 14, 2017

(30) Foreign Application Priority Data
Oct. 29, 2014 (JP) ................. 2014-220400

(51) Int. Cl.
*H05K 1/18* (2006.01)
*H01L 23/36* (2006.01)
(Continued)

(52) U.S. Cl.
CPC .............. *H01L 23/36* (2013.01); *H01L 23/13* (2013.01); *H01L 23/15* (2013.01);
(Continued)

(58) Field of Classification Search
CPC ........ H05K 1/02; H05K 2201/20; H05K 1/11; H05K 2201/09445; H05K 2201/09736;
(Continued)

(56) References Cited

U.S. PATENT DOCUMENTS 5,439,732 A * 8/1995 Nagasaka ........... H01L 21/4867
257/E23.075
5,731,066 A * 3/1998 Ando ................... B23K 1/0016
174/263

(Continued)

FOREIGN PATENT DOCUMENTS

EP         0245770 A2    11/1987
JP       2001274548 A    10/2001
(Continued)

OTHER PUBLICATIONS

International Search Report based on Application No. PCT/JP2015/080585 (2 Pages) dated Nov. 24, 2015.
(Continued)

*Primary Examiner* — Binh Tran
(74) *Attorney, Agent, or Firm* — Viering, Jentschura & Partner MBB

(57) ABSTRACT

A circuit board includes: a base body formed of ceramics or sapphire, the base body being provided with a through hole which penetrates therethrough from one principal face to another principal face of the base body; a through conductor containing silver as a major constituent, the through conductor being located inside the through hole of the base body; metallic wiring layers located on the respective principal faces of the base body and on the through conductor; and regions in which a compound containing at least one substance selected from Sn, Cu, and Ni is present between the through conductor and the metallic wiring layers.

20 Claims, 3 Drawing Sheets

(51) Int. Cl.
| | |
|---|---|
| *H01L 23/13* | (2006.01) |
| *H05K 3/46* | (2006.01) |
| *H05K 1/11* | (2006.01) |
| *H05K 3/40* | (2006.01) |
| *H01L 23/15* | (2006.01) |
| *H01L 23/498* | (2006.01) |
| *H05K 1/16* | (2006.01) |
| *H05K 7/10* | (2006.01) |
| *H05K 7/12* | (2006.01) |
| *H05K 1/02* | (2006.01) |
| *H01L 23/373* | (2006.01) |

(52) U.S. Cl.
CPC .. *H01L 23/49827* (2013.01); *H01L 23/49866* (2013.01); *H05K 1/11* (2013.01); *H05K 3/40* (2013.01); *H05K 3/46* (2013.01); *H01L 23/3731* (2013.01); *H01L 2224/48091* (2013.01); *H01L 2224/48227* (2013.01); *H01L 2924/00014* (2013.01); *H05K 1/02* (2013.01); *H05K 1/183* (2013.01); *H05K 2201/09427* (2013.01); *H05K 2201/09736* (2013.01); *H05K 2201/20* (2013.01)

(58) Field of Classification Search
CPC ......... H05K 1/183; H05K 2201/09427; H05K 2201/09436; H05K 2201/09454; H05K 2201/09472; H05K 2201/09481; H05K 2201/095; H05K 2201/09709; H05K 2203/1377; H05K 1/111; H05K 1/112; H05K 1/113; H05K 23/5226; H05K 1/0206; H05K 1/022; C23C 14/04
USPC ....... 361/748, 751, 760, 761, 765, 767, 771, 361/808; 174/261, 262
See application file for complete search history.

(56) References Cited

U.S. PATENT DOCUMENTS

| | | | |
|---|---|---|---|
| 8,222,529 B2* | 7/2012 | Sung | H05K 1/113 174/255 |
| 2007/0236896 A1* | 10/2007 | Takeuchi | H05K 3/246 361/748 |

FOREIGN PATENT DOCUMENTS

| | | |
|---|---|---|
| JP | 2006165137 A | 6/2006 |
| JP | 2009059789 A | 3/2009 |

OTHER PUBLICATIONS

Extended European Search Report received for European Application No. 15855600.1 dated Jan. 11, 2018 (7 Pages).

* cited by examiner

CIRCUIT BOARD AND ELECTRONIC DEVICE PROVIDED WITH SAME

RELATED APPLICATIONS

The present application is a national stage entry according to 35 U.S.C. § 371 of PCT application No.: PCT/JP2015/080585 filed on Oct. 29, 2015 which claims priority from Japanese application No.: 2014-220400 filed on Oct. 29, 2014, and is incorporated herein by reference in its entirety.

TECHNICAL FIELD

The present invention relates to a circuit board and an electronic device in which an electronic component is mounted on the circuit board.

BACKGROUND

With the recent trend toward more compact and lower-profile electronic devices, the packing density of various types of electronic components, including a semiconductor device, a heat-generating device, and a Peltier device, is on the increase. As a circuit board on which such an electronic component is mounted, there is a heretofore known circuit board comprising a base body, metallic wiring layers disposed on both principal faces of the base body, respectively, and a through conductor for transmission of heat produced during operation of an electronic component from the metallic wiring layer disposed on one of the principal faces on which the electronic component is mounted to the metallic wiring layer disposed on the other principal face.

For example, Patent Literature 1 proposes a through electrode-equipped board constructed of a substrate formed of glass or ceramics and having a hole penetrating therethrough from the front side to the back side thereof in the direction of substrate thickness, the through hole being filled with a metal constituting an electrode. In this construction, the through hole has an opening diameter a of 80 μm to 500 μm; the ratio a/b (b represents the substrate thickness) falls in the range of 0.2 to 0.5; a metallic film C is formed in a thickness of greater than or equal to 0.2 μm on the surface of a part of the inner wall of the through hole which extends from each side of the substrate to a point at a distance of at least 50 μm below each side; and the through hole is filled with an electrode metal D which is lower in melting point than the metallic film C.

CITATION LIST

Patent Literature

Patent Literature 1: Japanese Unexamined Patent Publication JP-A 2006-165137

SUMMARY

Technical Problem

With present-day electronic component sophistication, an increasingly large amount of heat is applied to a metallic wiring layer per unit area during operation of an electronic component, and consequently the temperature differences between operation and non-operation is becoming greater. In the following description, repeated cycles of operation and non-operation will be referred to as thermal cycling.

Under the thermal cycling with wide temperature differences, the neighboring portions of a base body, a metallic wiring layer, and a through conductor are prone to cracking or separation due to resultant expansion and contraction. Occurrence of cracking or separation hinders transmission of heat produced during operation of the electronic component, thus causing deterioration in heat-dissipation characteristics. This makes it impossible to make full use of the performance capability of the electronic component for a long period of time.

With this in view, there is a demand for a circuit board which allows efficient transmission of heat produced during operation of an electronic component from a metallic wiring layer disposed on one of board's principal faces on which the electronic component is mounted to another metallic wiring layer disposed on the other principal face via a through conductor, and is thus able to withstand thermal cycling for a long period of time.

The invention has been devised to satisfy the requirements as discussed supra, and accordingly an object of the invention is to provide a circuit board which has excellent heat-dissipation characteristics and is usable for a long period of time, and an electronic device in which an electronic component is mounted on the circuit board.

Solution to Problem

A circuit board according to the invention comprises: a base body formed of ceramics or sapphire, the base body being provided with a through hole which penetrates therethrough from one principal face to another principal face of the base body; a through conductor containing silver as a major constituent, the through conductor being located inside the through hole of the base body; metallic wiring layers located on the respective principal faces of the base body and on the through conductor; and regions in which a compound containing at least one substance selected from Sn, Cu, and Ni is present between the through conductor and the metallic wiring layers.

Moreover, an electronic device according to the invention comprises the above-mentioned circuit board of the invention and an electronic component disposed on any of the metallic wiring layers of the circuit board.

Advantageous Effects of Invention

The circuit board according to the invention has excellent heat-dissipation characteristics and is able to withstand thermal cycling for a long period of time.

Moreover, the electronic device according to the invention is constructed by disposing an electronic component on the metallic wiring layer of the above-mentioned circuit board of the invention, and thus allows the electronic component to deliver its performance capability for a long period of time, and affords high reliability.

DETAILED DESCRIPTION

Figure 1:
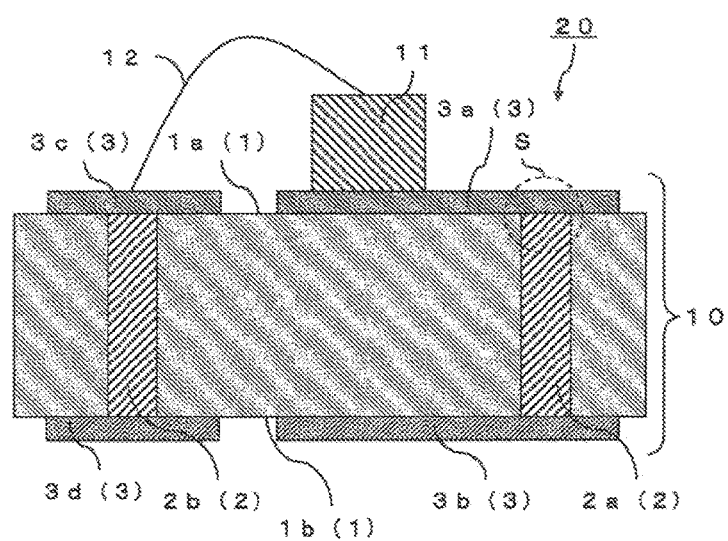
FIG. 1 is a sectional view showing an electronic device provided with a circuit board in accordance with a first embodiment.
Figure 2:
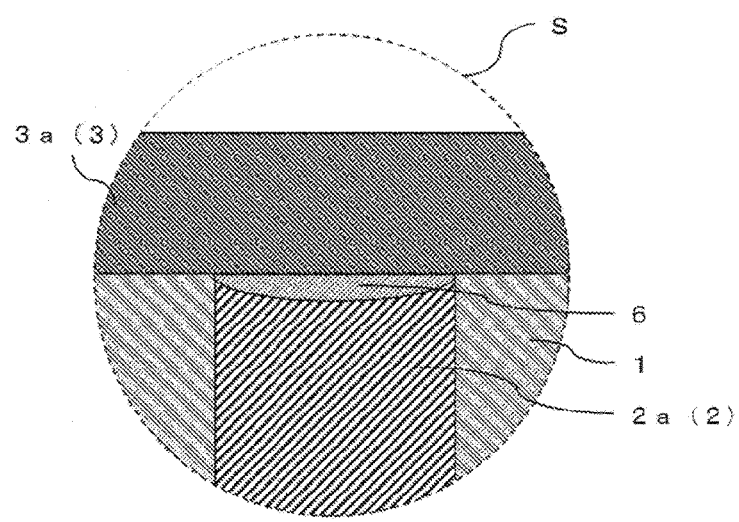
FIG. 2 is an enlarged view of a part S shown in FIG. 1.

Hereinafter, the present embodiment will be described by way of example with reference to drawings. FIG. 1 is a sectional view showing an electronic device provided with a circuit board in accordance with a first embodiment, and FIG. 2 is an enlarged view of a part S shown in FIG. 1.

A circuit board 10 according to the first embodiment comprises: a base body 1 provided with a through hole penetrating therethrough from one principal face 1a to the other principal face 1b of the base body 1; a through conductor 2 located inside the through hole of the base body 1; and metallic wiring layers 3 disposed on respective principal faces 1a and 1b of the base body 1.

In FIG. 1, there is shown a case where two through conductors 2 are provided. The metallic wiring layer 3 lying on a part of the one principal face 1a of the base body 1 on which an electronic component 11 is mounted is designated by reference numeral 3a, the through conductor 2 connected to the metallic wiring layer 3a is designated by reference numeral 2a, and the metallic wiring layer 3 lying on the other principal face 1b while making connection with the through conductor 2a is designated by reference numeral 3b. Moreover, the metallic wiring layer 3 lying on a part of the one principal face 1a of the base body 1 on which the electronic component 11 is not mounted is designated by reference numeral 3c, the through conductor 2 connected to the metallic wiring layer 3c is designated by reference numeral 2b, and the metallic wiring layer 3 lying on the other principal face 1b while making connection with the through conductor 2b is designated by reference numeral 3d.

An electronic device 20 in accordance with the present embodiment comprises the circuit board 10 of this embodiment and the electronic component 11 mounted on the metallic wiring layer 3 of the circuit board 10. FIG. 1 shows an example in which the electronic component 11 and the metallic wiring layer 3c are electrically connected to each other via a bonding wire 12.

The through conductor 2 of the circuit board 10 according to this embodiment contains Ag as a major constituent. As employed herein, the term "major constituent" refers to a component contained in the through conductor 2 in an amount of greater than 50% on the basis of 100% by mass representing the sum total of components constituting the through conductor 2.

The metallic wiring layer 3 of the circuit board 10 according to this embodiment contains one of Ag, Au, and Cu as a major constituent. As employed herein, the term "major constituent" refers to a component contained in the metallic wiring layer 3 in an amount of greater than 50% on the basis of 100% by mass representing the sum total of components constituting the metallic wiring layer 3.

As shown in FIG. 2 representing an enlarged view of the part S shown in FIG. 1, the circuit board 10 according to this embodiment includes a region 6 in which a compound containing at least one substance selected from Sn, Cu, and Ni (hereafter also referred to simply as "the compound") is present between the through conductor 2a provided in the base body 1 and the metallic wiring layer 3a. Although the region 6 is illustrated as being clearly defined by a boundary line in FIG. 2, in reality, there may be a case where no definite boundary line is visually identified.

The fulfillment of such a structural requirement makes it possible to restrain propagation of a crack developed due to thermal cycling, as well as to suppress occurrence of cracking caused by thermal cycling. Thus, the circuit board 10 in this embodiment is capable of efficient transmission of heat produced during operation of the electronic component 11 from the metallic wiring layer 3a to the metallic wiring layer 3b via the region 6 and the through conductor 2, and therefore has excellent heat-dissipation characteristics and withstands long-term thermal cycling.

The reason why propagation of a thermal cycling-caused crack can be restrained is that the presence of the compound helps stop the crack propagation. Moreover, the reason why occurrence of thermal cycling-caused cracking can be reduced is that, due to volumetric expansion entailed by compound formation, a compressive stress is applied to crystalline Ag around the compound, which results in resistance to cracking under expansion and contraction during thermal cycling.

It is particularly desirable to provide the region 6 in the vicinity of the opening edge of the through hole as shown in FIG. 2. This is because cracking tends to occur near the opening edge of the through hole due to thermal cycling.

For example, the compound refers to a Sn—Ag alloy when the compound contains Sn, refers to a Cu-containing oxide when the compound contains Cu, and refers to Ni-containing oxide when the compound contains Ni. The Sn—Ag alloy is lower in electrical resistance value than the Cu-containing oxide or the Ni-containing oxide, and is therefore suitable for use as the compound present in the region 6.

The following describes individual members constituting the circuit board 10 according to this embodiment.

Firstly, the base body 1 constituting the circuit board 10 according to this embodiment can be formed of ceramics or sapphire. Examples of usable ceramics include aluminum oxide ceramics, zirconium oxide ceramics, composite ceramics of aluminum oxide and zirconium oxide, silicon nitride ceramics, aluminum nitride ceramics, silicon carbide ceramics, and mullite ceramics.

For example, aluminum oxide ceramics is ceramics which contains aluminum oxide in an amount of greater than 50% of the content of all the constituent components of the ceramics. The base body 1 is preferably formed of ceramics which is inexpensive, can be worked on relatively easily, and has excellent mechanical characteristics, or more preferably formed of aluminum oxide ceramics, in particular.

Moreover, while the metallic wiring layer 3 constituting the circuit board 10 according to this embodiment contains one of Ag, Au, and Cu as a major constituent as described above, from the standpoint of adhesion of the metallic wiring layer 3 to the through conductor 2, the metallic wiring layer 3 preferably contains Ag as a major constituent.

It is also preferable that the metallic wiring layer 3 contains a glass component such as $SiO_2$, $Bi_2O_3$, $B_2O_3$, or ZnO. The metallic wiring layer 3 containing such a glass component adheres to the base body 1 with higher adhesion strength. As another constituent, for example, Mg, Ca, Zr, Ti, or Mo can be contained in the metallic wiring layer 3.

Moreover, the through conductor 2 constituting the circuit board 10 in this embodiment is preferably designed so that a compound containing at least one substance selected from Sn, Cu, and Ni is present throughout its entirety. In the case where the compound containing at least one substance selected from Sn, Cu, and Ni is present throughout the through conductor 2 of entirety, due to volumetric expansion entailed by the formation of the compound containing at least one substance selected from Sn, Cu, and Ni, the area of contact between the through conductor 2 and the inner wall of the through hole is increased, with the consequent attainment of excellent heat-dissipation characteristics. Moreover, due to the above-described volumetric expansion, a compressive stress is applied to crystalline Ag around the compound, which results in resistance to cracking under thermal cycling.

Figure 3:
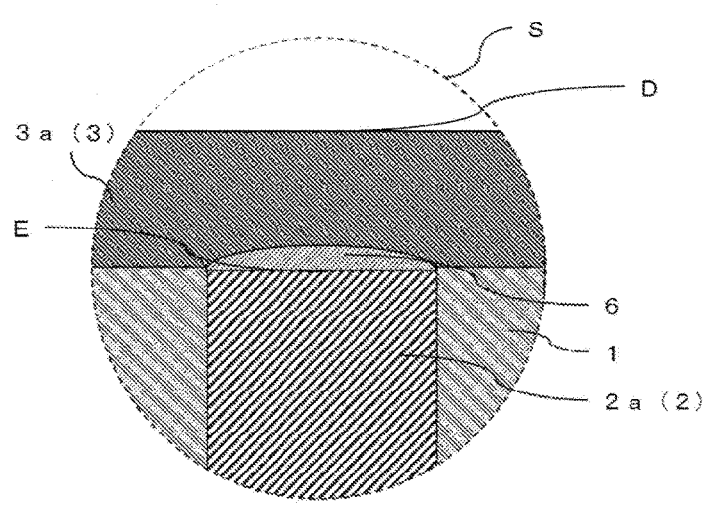
FIG. 3 is an enlarged view showing a part of a circuit board according to a second embodiment that corresponds to the part S shown in FIG. 1.

Secondly, FIG. 3 is an enlarged view showing a part of a circuit board according to a second embodiment that corresponds to the part S shown in FIG. 1. As shown in FIG. 3, it is preferable that the region 6 protrudes toward the metallic wiring layer 3a in relation to the one principal face 1a of the base body 1.

Under thermal cycling, a metallic wiring layer 3a-side part of the edge of the through hole is particularly susceptible to cracking. Thus, the region 6 protruding toward the metallic wiring layer 3a in relation to the one principal face 1a of the base body 1 is conducive to suppression of propagation of a crack developed due to thermal cycling. Moreover, where the region 6 lies in the position as shown in FIG. 3, the through conductor 2a has no recessed area, wherefore the metallic wiring layer 2a can be formed without causing the surface of the metallic wiring layer 2a located at the through hole to be recessed. This makes it possible to increase the area of contact between the metallic wiring layer and the electronic component 11 mounted thereon.

In the construction in which the region 6 protrudes toward the metallic wiring layer 3a in relation to the one principal face 1a of the base body 1, In light of heat conductivity and changes of color resulting from plating, it is preferable that, when the range from a line E (the line representing the surface of the one principal face 1a of the base body 1) to a line D (the line representing the surface of the metallic wiring layer 3) as shown in FIG. 3 is set to 1, the extent to which the region 6 extends from the one principal face 1a of the base body 1 is up to 0.4.

In the circuit board 10 according to this embodiment, the average crystal grain size of the compound preferably falls in the range of 10 μm or greater and 30 μm or less. The fulfillment of this range makes it possible to apply a greater compressive stress to crystalline Ag around the compound while maintaining the heat-dissipation characteristics, and thereby render the circuit board 10 resistant to thermal cycling for a longer period of time.

In the circuit board 10 according to this embodiment, a surface layer formed of Au is preferably located on the metallic wiring layer 3. The fulfillment of this arrangement makes it possible to facilitate the process of adhering the metallic wiring layer 3 tightly to the bonding wire 12, as well as to retard sulfidization-induced corrosion in the metallic wiring layer 3.

The following describes a method to check the presence of the region 6 in which the compound containing at least one substance selected from Sn, Cu, and Ni is present. Firstly, a section as shown in FIG. 2 for observation is obtained by cutting the circuit board 10 along the center of the axis of the through conductor 2, and subsequently polishing the plane of section by Cross-section Polisher (CP).

Next, examination may be performed by observing an image of the section for observation under magnification by 1000 or greater and 3000 or less times with use of, for example, a scanning electron microscope (SEM), and performing mapping using EPMA (Electron Probe Microanalyzer).

More specifically, identifications of the metallic wiring layer 3, the region 6, and the through conductor 2 are roughly made on the basis of the differences among them in respect of crystalline Ag size, a location where other compound than crystalline Ag is present, and constituent components (elements) as observed at, for example, the one principal face 1a, the interior of the through hole, and the area between the one principal face 1a and the interior of the through hole, in the course of image observation and mapping. For example, where the metallic wiring layer 3 and the through conductor 2 contain Ag and a Ag—Sn alloy is present in the region 6, the metallic wiring layer 3, the region 6, and the through conductor 2 can be identified on the basis of the presence of Sn.

In the region 6 so identified, when Ag is seen in its part where Sn has been observed, then the Sn—Ag alloy can be considered to be present. Moreover, in the region 6, when the presence of O (oxygen) is recognized in its part where Cu has been observed, then a Cu oxide can be considered to be present. Furthermore, in the region 6, when the presence of O is recognized in its part where Ni has been observed, then a Ni oxide can be considered to be present.

Moreover, the average crystal grain size of the compound containing at least one substance selected from Sn, Cu, and Ni can be determined through an analysis of the compound so examined by the above-described method, using an image analysis software capable of calculation of an average value of all the crystal grain sizes in terms of equivalent circle diameter (for example, ImageJ).

The following describes a method for manufacturing the circuit board 10 according to this embodiment by way of example. The following description deals with a case where the base body 1 is formed of aluminum oxide ceramics. The base body 1 can be produced by heretofore known molding technique and firing process using powder of aluminum oxide ($Al_2O_3$) and powder of sintering aids such as silicon oxide ($SiO_2$), magnesium oxide (MgO), or calcium oxide (CaO).

Moreover, in the case of using the circuit board 10 in this embodiment as a light-emitting device mounting substrate on which is mounted a light-emitting diode (LED), the addition of barium oxide (BaO) or zirconium oxide ($ZrO_2$) as a constituent of the base body 1 helps improve the reflectivity of the base body 1.

Moreover, a method for forming the through hole in the base body 1 may include subjecting a molded product of the base body 1 to punching, blasting, or lasering, or subjecting a sintered product of the base body 1 to blasting or lasering.

Next, a metallic paste for forming the through conductor 2 and the metallic wiring layer 3 is prepared. The following description deals with a case where the metallic wiring layer 3 is predominantly composed of Ag.

The metallic paste for forming the through conductor 2 and the metallic wiring layer 3 is composed of Ag powder having an average particle size of 0.5 μm or greater and 10 μm or less, glass powder, and an organic vehicle. As the Ag powder, powder having an average particle size of 0.5 μm or greater and 3.5 μm or less may be prepared. To obtain the metallic wiring layer 3 predominantly composed of Cu, Cu powder may be used. To obtain the metallic wiring layer 3 predominantly composed of Au, Au powder may be used.

As the glass powder, one having a softening point of 500° C. or higher and 700° C. or lower, or, in particular, one having a softening point of 600° C. or higher and 700° C. or lower, is desirable for use. Moreover, the average particle size of the glass powder is preferably greater than or equal to 8% and less than or equal to 60% of the average particle size of the Ag powder. In the case where the softening point of the glass powder falls in the range of 600° C. or higher and 700° C. or lower, and the average particle size of the glass powder is greater than or equal to 8% and less than or equal to 60% of the average particle size of the Ag powder, the glass powder contained in the metallic paste is readily softened during firing, and is thus able to move toward the base body 1 smoothly. This makes it possible to increase the strength of adhesion between the base body 1 and the through conductor 2 or the metallic wiring layer 3.

Examples of the glass powder of such a type include $R_2O$—$B_2O_3$—$SiO_2$ (R represents an alkali metal element) powder, $SiO_2$—$Bi_2O_3$—$B_2O_3$-based powder, $R_2O$—$SiO_2$—$B_2O_3$—$Bi_2O_3$-based powder, $SiO_2$—ZnO—$B_2O_3$-based powder, and $R_2O$—$SiO_2$—$B_2O_3$—ZnO-based powder.

Moreover, the organic vehicle is obtained by dissolving an organic binder in an organic solvent. For example, in the organic vehicle, the ratio between the organic binder and the organic solvent is 2 through 6 for the organic solvent with respect to 1 for the organic binder. As the organic binder, for example, it is possible to use one of materials or a mixture of two or more materials selected from acrylic materials such as polybutyl methacrylate and polymethyl methacrylate, cellulosic materials such as nitrocellulose, ethylcellulose, cellulose acetate, and butylcellulose, polyether materials such as polyoxymethylene, and polyvinylic materials such as polybutadiene and polyisoprene.

Moreover, as the organic solvent, for example, it is possible to use one of materials or a mixture of two or more materials selected from carbitol, carbitol acetate, terpineol, meta-cresol, dimethyl imidazole, dimethyl imidazolidinone, dimethyl formamide, diacetone alcohol, triethylene glycol, paraxylene, ethyl lactate, and isophorone.

On the basis of 100% by mass of the metallic paste, for example, the Ag powder is blended in an amount of 77.0% by mass or greater and 92.0% by mass or less, the glass powder is blended in an amount of 0.5% by mass or greater and 5% by mass or less, and the organic vehicle is blended in an amount of 10% by mass or greater and 20% by mass or less.

Next, a region paste for forming the region 6 is prepared. The region paste for forming the region 6 is composed of Ag powder having an average particle size of 0.5 μm or greater and 10 μm or less, additive powder formed of at least one substance selected from Sn, Cu, and Ni having an average particle size of 5 μm or greater and 10 μm or less, and an organic vehicle. On the basis of 100% by mass of the region paste, for example, the Ag powder is blended in an amount of 64.0% by mass or greater and 81.0% by mass or less, the additive powder is blended in an amount of 9.0% by mass or greater and 16.0% by mass or less, and the organic vehicle is blended in an amount of 10.0% by mass or greater and 20.0% by mass or less.

Subsequently, with use of the metallic paste so prepared, the through hole of the base body 1 is filled with the metallic paste by a heretofore known printing technique. After applying the region paste onto the metallic paste set in the through hole, the metallic paste is further applied onto the region paste by a heretofore known printing technique.

Then, by performing a drying process at a temperature of 80° C. or higher and 150° C. or lower, performing a degreasing process at a temperature of 400° C. or higher and 500° C. or lower under retention time of 6 minutes or longer and 30 minutes or shorter, and performing heat treatment at a maximum temperature of 800° C. or higher and 920° C. or lower under retention time of 6 minutes or longer and 24 minutes or shorter, the circuit board 10 according to this embodiment can be obtained.

The region 6 can be formed so as to protrude toward the metallic wiring layer 3 in relation to the one principal face 1a of the base body 1 by filling the through hole with the metallic paste so that the through conductor 2 can be formed so as to reach the opening edge of the through hole, performing heat treatment, applying the region paste, applying the metallic paste for forming the metallic wiring layer 3 onto the region paste, and performing heat treatment again.

The following describes another example of the method for manufacturing the circuit board 10 according to this embodiment, by which the region 6 can be formed so as to protrude toward the metallic wiring layer 3 in relation to the one principal face 1a of the base body 1. A paste for forming the metallic wiring layer 3 used in this method is identical with the above-described metallic paste except that the glass powder is blended therein in an amount of 2.0% by mass or greater and 5% by mass or less.

Moreover, a through-conductor paste for forming the through conductor 2 used in this method is composed of Ag powder that is greater in average particle size than the Ag powder used for the metallic paste, additive powder formed of at least one substance selected from Sn, Cu, and Ni having an average particle size of 5 μm or greater and 10 μm or less, and an organic vehicle. On the basis of 100% by mass of the through-conductor paste, for example, the Ag powder is blended in an amount of 64.0% by mass or greater and 81.0% by mass or less, the additive powder is blended in an amount of 9.0% by mass or greater and 16.0% by mass or less, and the organic vehicle is blended in an amount of 10.0% by mass or greater and 20.0% by mass or less.

Then, after filling the through hole of the base body 1 with the through-conductor paste by a heretofore known printing technique, the metallic paste is further applied onto the through-conductor paste by a heretofore known printing technique.

Then, by performing a drying process at a temperature of 80° C. or higher and 150° C. or lower, performing a degreasing process at a temperature of 400° C. or higher and 500° C. or lower in an air atmosphere under retention time of 6 minutes or longer and 30 minutes or shorter, and performing heat treatment at a maximum temperature of 850° C. or higher and 900° C. or lower under retention time of 6 minutes or longer and 12 minutes or shorter, there is obtained the circuit board 10 in which the region 6 protrudes toward the metallic wiring layer 3 in relation to the one principal face 1a of the base body 1.

According to this manufacturing method, since the Ag powder used for the through-conductor paste is greater in average particle size than the Ag powder used for the metallic paste, it it possible to increase the mobility of the additive powder contained in the through-conductor paste. Moreover, in the course of the heat treatment under the above-described conditions, the glass component contained in the metallic paste for forming the metallic wiring layer 3 moves toward the base body 1, thus causing the additive powder contained in the through-conductor paste for forming the through conductor 2 to diffuse toward the metallic wiring layer 3. Consequently, the region 6 having the compound containing at least one substance selected from Sn, Cu, and Ni protrudes toward the metallic wiring layer 3 in relation to the one principal face 1a of the base body 1.

A way to impart a desired thickness to the metallic wiring layer 3 is by performing the printing process, the drying process, the degreasing process, and the firing process repeatedly, or by repeating the printing process, the drying process, and the degreasing process a plurality of times, followed by heat treatment in one go.

To obtain the metallic wiring layer 3 which contains Cu or Au as a major constituent, Cu powder or Au powder is used instead of the above-described Ag powder. In this case, heat treatment is performed at a temperature which is suitable to each major constituent.

As an alternative to the way of obtaining the metallic wiring layer 3 which contains Cu or Au as a major constituent, after forming the through conductor 2 by filling the through hole of the base body 1 with the through-conductor paste and, on an as needed basis, the region paste by a heretofore known printing technique and subsequently performing heat treatment without metallic paste application, a metallic wiring layer 3 formed of Cu or Au is formed by a heretofore known plating or sputtering technique.

Moreover, the metallic wiring layer 3 has a thickness of 5 μm or greater and 30 μm or less, for example. In the interest of finer-pitch arrangement and finer-line configuration, it is advisable to adopt an etching technique to form the metallic wiring layer 3.

Moreover, to form the surface layer formed of Au located on the metallic wiring layer 3, the surface of the metallic wiring layer 3 is entirely or partly coated with gold plating. Instead of the gold plating, silver plating or nickel-gold plating may be adopted.

Moreover, in the production of the circuit board 10 in this embodiment, a large number of circuit boards 10 can be formed efficiently by preparing the base body 1 formed with dividing grooves, forming the through conductor 2 and the metallic wiring layer 3 at each section of the base body 1 surrounded by the corresponding dividing grooves in the above-described manner, and dividing the base body 1 into pieces. Note that the method for manufacturing the circuit board 10 according to this embodiment is not limited to the above-described manufacturing methods.

Next, the electronic device 20 in accordance with the present embodiment can be obtained by, for example, mounting the electronic component 11 on the first metallic wiring layer 3a of the circuit board 10 according to this embodiment. The thus obtained electronic device 20 according to this embodiment allows the electronic component to deliver its performance capability for a long period of time, and affords high reliability.

Examples of the electronic component 11 which is mounted on the circuit board 10 include: semiconductor devices such as insulated gate bipolar transistor (IGBT) device, intelligent power module (IPM) device, metal-oxide semiconductor field-effect transistor (MOSFET) device, light-emitting diode (LED) device, free-wheeling diode (FWD) device, giant transistor (GTR) device, and schottky barrier diode (SBD); heating elements for use in sublimation thermal printer heads or thermal ink-jet printer heads; and Peltier devices.

While examples of the invention will hereafter be described concretively, the invention is not limited to the following examples.

Examples

Circuit boards of different designs were produced to be tested for durability under thermal cycling.

To begin with, there was formed a base body composed of aluminum oxide ceramics with an aluminum oxide content of 96% by mass, and silicon oxide and magnesium oxide that serve as sintering aids. The base body was subjected to lasering to form a 120 μm-diameter through hole therein.

Subsequently, as a paste for forming the through conductor and a paste for forming the metallic wiring layer like, the following were prepared.

As the paste for forming the metallic wiring layer, Ag powder having an average particle size of 2.0 μm, $R_2O$—$B_2O_3$—$SiO_2$-based glass powder having an average particle size of 1.3 μm and a softening point of 630° C., and an organic vehicle were prepared.

The Ag powder, the glass powder, and the organic vehicle were weighed out so as to fulfill a composition of the glass powder of 2.5% by mass, the organic vehicle of 15% by mass, and the Ag powder as the balance, and these constituents were mixed, whereby the paste for forming the metallic wiring layer was obtained.

Moreover, as the through-conductor-forming paste, Ag powder having an average particle size of 5 μm, additive powder of each substance serving as a secondary component as listed in Table 1 having an average particle size of 5 μm, and an organic vehicle were prepared.

The Ag powder, the additive powder, and the organic vehicle were weighed out so as to fulfill a composition of the additive powder of 2.5% by mass, the organic vehicle of 15% by mass, and the Ag powder as the balance, and these constituents were mixed, whereby the through conductor-forming paste was obtained.

Then, with a printing method, the through hole was filled with the through conductor-forming paste, and, the paste for forming the metallic wiring layer was printed. After that, subsequent to 100° C.-drying process, heat treatment was performed at a maximum temperature of 850° C. or higher and 900° C. or lower in an air atmosphere under retention time of 10 minutes. At this time, the average particle size of the compound was adjusted by controlling the maximum temperature within the above-described range. In this way, Samples Nos. 3, 5, 7, 9, 11, 13, and 15 were produced.

Moreover, Sample No. 1 was produced in a manner similar to that as described above except for the use of an additive powder-free paste prepared through the weighing of Ag powder and an organic vehicle so as to have a composition of 15% by mass organic vehicle, the balance being Ag powder.

Then, the paste for forming the metallic wiring layer used in the foregoing method was used as a paste for both of the metallic wiring layer and the through conductor (hereafter referred to as "the paste 1"). Moreover, the through conductor-forming paste used in the foregoing method was used as a region paste (hereafter referred to as "the paste 2").

After filling the through hole with the paste 1 by the printing method, the paste 2 was applied thereon, and then, subsequent to 100° C.-drying process, heat treatment was performed at a maximum temperature of 850° C. or higher and 900° C. or lower in an air atmosphere under retention time of 10 minutes. It is noted that with respect to the heat-treatment temperature, Sample No. 2 was identical to Sample No. 3, Sample No. 4 was identical to Sample No. 5, Sample No. 6 was identical to Sample No. 7, Sample No. 8 was identical to Sample No. 9, Sample No. 10 was identical to Sample No. 11, Sample No. 12 was identical to Sample No. 13, and Sample No. 14 was identical to Sample No. 15. In this way, Sample Nos. 2, 4, 6, 8, 10, 12, and 14 were produced.

The presence of the compound-present region was determined by obtaining a section for observation by cutting each sample along the center of the axis of the through conductor, and subsequently polishing the plane of section by a cross-section polisher (CP), and then, subjecting an image of the section magnified by 1000 or greater and 3000 or less times to mapping using EPMA for the determination. As to Sn-containing Samples, a Sn—Ag compound was present, as to Cu-containing Samples, Cu oxide was present, and as to Ni-containing Samples, Ni oxide was present. Moreover, the whereabouts of the region in each sample has been determined. In Table 1, samples having the region lying in a position as shown in FIG. 2 are listed with a description of "FIG. 2", whereas samples having the region lying in a position as shown in FIG. 3 are listed with a description of "FIG. 3".

Moreover, as to samples in which the presence of the compound was confirmed, the average crystal grain size of the compound was determined with use of an image analysis software capable of calculation of an average value of all the crystal grain sizes in terms of equivalent circle diameter (ImageJ).

In addition, heat cycle testing was conducted to examine the durability of each sample under thermal cycling.

25 samples were prepared to be submitted to the heat cycle testing using thermal shock test equipment. A cycle of testing operations comprises: a decrease in environmental temperature for each sample from room temperature (25° C.) to −45° C.; a 30-minute retention at this temperature; a temperature increase to 100° C.; a 30-minute retention at this temperature; and a temperature decrease to room temperature. In the 300- to 1500-cycle range, each sample was taken out every time 50 cycles elapsed to be experimentally biased at 1 mA. Table 1 shows a listing of the number of times of the heat cycle having been carried out until each sample has suffered a break.

TABLE 1

| Sample No. | Substance | Presence or absence of Compound | Position of Region | Average particle size of Compound (μm) | Heat cycle (Number of times) |
|---|---|---|---|---|---|
| 1 | — | Absent | — | — | 300 |
| 2 | Sn | Present | FIG. 2 | 8 | 450 |
| 3 | Sn | Present | FIG. 3 | 8 | 500 |
| 4 | Sn | Present | FIG. 2 | 10 | 750 |
| 5 | Sn | Present | FIG. 3 | 10 | 800 |
| 6 | Sn | Present | FIG. 2 | 15 | 1350 |
| 7 | Sn | Present | FIG. 3 | 15 | 1500 |
| 8 | Sn | Present | FIG. 2 | 30 | 900 |
| 9 | Sn | Present | FIG. 3 | 30 | 1000 |
| 10 | Sn | Present | FIG. 2 | 35 | 550 |
| 11 | Sn | Present | FIG. 3 | 35 | 600 |
| 12 | Cu | Present | FIG. 2 | 15 | 1100 |
| 13 | Cu | Present | FIG. 3 | 15 | 1200 |
| 14 | Ni | Present | FIG. 2 | 15 | 1100 |
| 15 | Ni | Present | FIG. 3 | 15 | 1200 |

As shown in Table 2, it is found that the presence of the region in which the compound containing at least one substance selected from Sn, Cu, and Ni is present between the through conductor and the metallic wiring layer allows an improvement in durability to withstand thermal cycling. In addition, it is found that the compound present in the region is preferably a Sn—Ag alloy. Further, it is found that the region should preferably protrudes toward the metallic wiring layer in relation to the principal face of the base body. Furthermore, it is found that further improvement in durability to withstand thermal cycling is achieved when the average crystal grain size of the compound falls in the range of 10 μm or greater and 30 μm or less.

What is claimed is:

1. A circuit board, comprising:
a base body formed of ceramics or sapphire, the base body being provided with a through hole which penetrates therethrough from one principal face to another principal face of the base body;
a through conductor comprising silver as a major constituent, the through conductor being located inside the through hole of the base body;
metallic wiring layers located on the respective principal faces of the base body and on the through conductor; and
regions in which a compound comprising at least one substance selected from the group consisting of Ni oxide, Sn, and Cu is present between the through conductor and the metallic wiring layers.

2. The circuit board according to claim 1,
wherein the base body is formed of ceramics, and the metallic wiring layers comprise Ag as a major constituent.

3. The circuit board according to claim 1,
wherein the regions protrude from the one principal face and/or the other principal face toward the metallic wiring layers.

4. The circuit board according to claim 1,
wherein an average crystal grain size of the compound falls in a range of 10 μm or greater and 30 μm or less.

5. The circuit board according to claim 1,
wherein surface layers formed of Au are located on the metallic wiring layers.

6. An electronic device, comprising:
the circuit board according to claim 1; and
an electronic component disposed on at least one of the metallic wiring layers of the circuit board.

7. The circuit board according to claim 1,
wherein the regions are located inside the through hole between the one principal face and the other principal face.

8. The circuit board according to claim 1,
wherein the regions are in direct contact with the through conductor.

9. The circuit board according to claim 1,
wherein the compound comprises Sn—Ag.

10. The circuit board according to claim 1,
wherein the compound comprises Cu oxide.

11. The circuit board according to claim 1,
wherein the metallic wiring layers further comprise a glass component.

12. The circuit board according to claim 11,
wherein the glass component is selected from the group consisting of: $SiO_2$, $Bi_2O_3$, $B_2O_3$, and ZnO.

13. The circuit board according to claim 11,
wherein the metallic wiring layers further comprise another constituent selected from the group consisting of: Mg, Ca, Zr, Ti, and Mo.

14. The circuit board according to claim 1,
wherein the compound comprises Ni oxide.

15. The circuit board according to claim 3,
wherein the regions protrude up to 40 percent of a distance from the one principal face and/or the other principal face to an outermost surface of the metallic wiring layers.

16. A circuit board, comprising:
a base body comprising a through hole penetrating from a first face to a second face of the base body;
a through conductor within the through hole;
a first metallic wiring layer located on the first face of the base body and over a first opening of the through hole;
a first region comprising a compound of one or more elements selected from the group consisting of Ni, Sn, and Cu, wherein the first region is located between a first end of the through conductor and the first metallic wiring layer;

a second metallic wiring layer located on the second face of the base body and over a second opening of the through hole; and a second region comprising a compound of one or more elements selected from the group consisting of Ni, Sn, and Cu, wherein the second region is located between a second end of the through conductor and the second metallic wiring layer.

17. The circuit board according to claim 16, wherein the first region and the second region are located within the through hole between the first face and the second face of the base body.

18. The circuit board according to claim 16, wherein the first region protrudes out of the through hole from the first face of the base body into the first metallic wiring layer and the second region protrudes out of the through hole from the second face of the base body into the second metallic wiring layer.

19. The circuit board according to claim 16, wherein the first region directly contacts the first end of the through conductor and the first metallic wiring layer and the second region direction contacts the second end of the through conductor and the second metallic wiring layer.

20. The circuit board according to claim 16, wherein the through conductor further comprises the compound from the first region and second region throughout its entirety.

* * * * *

UNITED STATES PATENT AND TRADEMARK OFFICE
CERTIFICATE OF CORRECTION

PATENT NO. : 10,147,662 B2
APPLICATION NO. : 15/522322
DATED : December 4, 2018
INVENTOR(S) : Yuuichi Abe Page 1 of 1

It is certified that error appears in the above-identified patent and that said Letters Patent is hereby corrected as shown below:

Column 4, Line 19 and 23: Delete "Sn—Ag" and write --Sn-Ag-- in place thereof.

Column 6, Line 6: Delete "Ag—Sn" and write --Ag-Sn-- in place thereof. Line 11: Delete "Sn—Ag" and write --Sn-Ag-- in place thereof.

Column 10, Line 64: Delete "Sn—Ag" and write --Sn-Ag-- in place thereof.

Column 11, Line 54: Delete "Sn—Ag" and write --Sn-Ag-- in place thereof.

Column 12, Line 37: Delete "Sn—Ag" and write --Sn-Ag-- in place thereof.

Signed and Sealed this
Twenty-fourth Day of September, 2019

Andrei Iancu
*Director of the United States Patent and Trademark Office*